United States Patent
Fleming et al.

(10) Patent No.: US 8,928,348 B1
(45) Date of Patent: Jan. 6, 2015

(54) CURRENT-MODE-LOGIC DEVICES RESISTANT TO SINGLE EVENT DISTURBANCES

(71) Applicants: Patrick Fleming, Arlington, VA (US); Bin Li, Chantilly, VA (US); Lloyd Brown, Fredericksburg, VA (US)

(72) Inventors: Patrick Fleming, Arlington, VA (US); Bin Li, Chantilly, VA (US); Lloyd Brown, Fredericksburg, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 69 days.

(21) Appl. No.: 13/669,764

(22) Filed: Nov. 6, 2012

Related U.S. Application Data

(60) Provisional application No. 61/556,912, filed on Nov. 8, 2011.

(51) Int. Cl.
*H03K 19/003* (2006.01)
*H03K 19/00* (2006.01)

(52) U.S. Cl.
USPC .................................. 326/9; 326/8; 326/15

(58) Field of Classification Search
CPC ............ H03K 3/2885; H03K 19/0033; H03K 19/00338; H03K 19/23; H03K 3/0375; H03K 3/2897; H03K 19/018578; H03K 19/0866; H03K 19/0948; H03K 3/356034; H03F 3/347; H03F 3/72
USPC ................... 326/8–15, 68, 82, 121, 126, 127; 327/144, 103, 185, 187, 208
See application file for complete search history.

(56) References Cited

U.S. PATENT DOCUMENTS

| | | | | |
|---|---|---|---|---|
| 5,311,070 A | * | 5/1994 | Dooley | 327/208 |
| 5,600,260 A | | 2/1997 | LaMacchia et al. | |
| 6,100,716 A | * | 8/2000 | Adham et al. | 326/68 |
| 6,127,864 A | * | 10/2000 | Mavis et al. | 327/144 |
| 6,667,520 B1 | * | 12/2003 | Fulkerson | 257/369 |
| 7,646,254 B2 | * | 1/2010 | Kantor et al. | 331/2 |
| 7,688,112 B2 | * | 3/2010 | Katzman et al. | 326/82 |
| 7,859,292 B1 | * | 12/2010 | Shuler, Jr. | 326/11 |

* cited by examiner

*Primary Examiner* — Vibol Tan
(74) *Attorney, Agent, or Firm* — Daniel J. Long

(57) ABSTRACT

A current-mode-logic gate designed to have a first electronic path and a second electronic path. Each electronic path has a pair of transistors. The second electronic path is physically separated and identical to the first electronic path. In operation, a first input signal is transmitted through the first electronic path of the current-mode-logic gate to produce a first output signal. Similarly, a second input signal is transmitted through the second electronic path of the current-mode-logic gate to produce a second output signal.

19 Claims, 4 Drawing Sheets

CURRENT-MODE-LOGIC DEVICES RESISTANT TO SINGLE EVENT DISTURBANCES

RELATED APPLICATIONS

This Application claims rights under 35 USC §119(c) from U.S. application Ser. No. 61/556,912 filed Nov. 8, 2011, the contents of which are incorporated herein by reference.

TECHNICAL FIELD

Various embodiments described herein relate to electronic circuits and digital processing systems generally, including current-mode-logic gates in such systems.

BACKGROUND

Existing current-mode-logic (CML) gates are vulnerable to single-event effects, such as, single-event upsets (SEU) and single-event transients (SET). A SEU is an unwanted change of state in memory elements (i.e. state of change error) at the output of the affected devices. A SEU typically affects memory or sequential elements (e.g. latches or flip-flops). Similarly, a SET is one or more voltage pulses that propagate through an electronic circuit causing an incorrect value latched within a sequential logic unit. These unwanted changes of state in memory elements are typically caused by external elements acting on an electrical circuit. For example, in an environment such as space, ionizing particles traveling through space may contact devices such as a satellite, producing a SEU or SET within the device's internal electronic circuitry.

To prevail errors within integrated electronic circuits caused by SEUs and SETs, the current passing through CML gates can be increased. Increasing the current within an integrated circuit, however, increases the circuit's power consumption and requires larger system components. As a result of increasing the current flowing through CML gates, the gates become ineffectual for small technology nodes. Small technology nodes cannot withstand the increased power usage due to the size of node's internal components.

Other devices have attempted to prevent errors within integrated electronic circuits by having several CML gates within an electronic circuit. The purpose for having several CML gates is to prevent the circuit from originating a signal error. These devices, however, require additional power to operate the circuit because voltage is transmitted through several CML gates. Moreover, the cost of these electronic circuits is higher because more components are installed within the circuit. Also, the size of the electronic circuit is larger to accommodate the installation of the additional CML gates. A need, therefore, exists for CML gates that are resistant to SEU and SET effects and suitable for use with small technology nodes.

SUMMARY

We have recognized that what is needed to solve the problem of unwanted changes in memory elements for integrated electronic circuits having current-mode-logic (CML) gates is to manufacture CML gates having physically separated identical electronic paths. Unlike prior art devices that are designed to prevent an error from originating at CML gate the subject matter of this disclosure describes devices and methods for preventing the propagation of an error through a CML gate.

The CML gates described in this disclosure allow for more energy efficient electronic circuits because input signals may be transmitted through a reduced number of CML gales than other prior art devices. Moreover, the amount of energy required to operate the electronic circuit is reduced because a lower amount of current is required to operate the circuit while preventing errors caused by single-event effects. Furthermore, decreasing the number of CML gates used to prevent improper electronic circuit operation due to erroneous electronic signals results in lower manufacturing costs and smaller electronic circuit footprint.

The propagation of a signal with an electronic circuit may be prevented using CML gates having physically separated and identical electronic paths for transmitting an input signal. The physically separated and identical electronic paths may transmit multiple signals through the CML gate. Transmitting these multiple signals through the CML gate produces multiple output signals. These output signals can be used to prevent unwanted voltage pulses from propagating through the electronic circuit causing unwanted changes of state in output device memory elements or an incorrect value latched within an output device, such as a sequential logic unit. A signal error may be identified by comparing CML gate output signals to one another. When the output signals are not equal or do not have the same value, a signal error is detected.

We also recognized that identifying the presence of single-event effect acting on an integrated electronic circuit may allow the electronic-circuit operator to better monitor the performance and/or reliability of electronic circuit. In accordance with the disclosure, then, an input signal may be transmitted through at least two physically separated and identical electronic paths of a current-mode-logic gate creating at least two output signals. These output signals or their corresponding output values may be compared to one another. The presence of single-event effect acting on the integrated electronic circuit may be identified when the output signals or their values are not equal to one another.

BRIEF DESCRIPTION OF THE DRAWINGS

Other objects, features and advantages will occur to those skilled in the art from the following description and accompanying drawings, in which.

DETAILED DESCRIPTION

Figure 1:
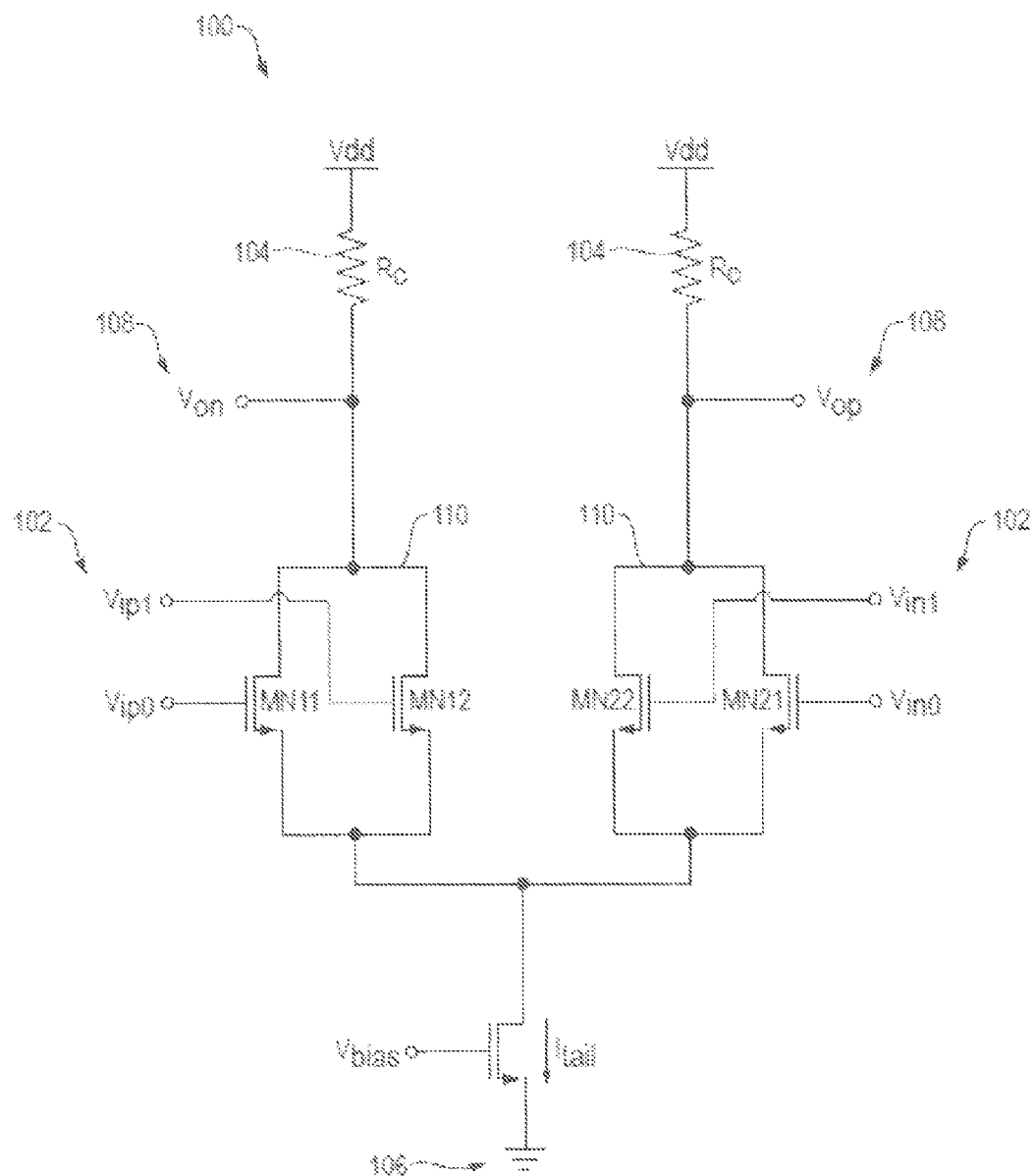
FIG. 1 is a CML gate block diagram of the preferred embodiment of the disclosure.

FIG. 1 is a block diagram of current-mode-logic (CML) gate 100 according to a preferred embodiment of the present disclosure. The subject matter of this disclosure applies to various CML gates including but not limited to logic gates such an inverter, nand, and nor. The Program Mode: Edit-Txt, Division: IDC CML gate 100 may be implemented in various complex electronic circuits including but not limited to latches or mixers. The CML gate may include but is not limited to a voltage source 102, resistors 104, ground connection 106, output voltages 108, and electronic paths 110.

The voltage source 102 provides the input voltage for the electronic circuit. The resistors 104 resist the flow of current within the integrated electronic. The circuit ground connection 106 allows the circuit's current to flow to ground. The output voltages 108 are circuit voltages that may be supplied to other electronic devices.

The CML gate 100 may have two or more electronic paths 110. The electronic paths 110 may be two or more independent electronic paths allowing current to flow through the CML gate. These paths are physically separated to prevent a SEU or SET from adversely affecting the output voltage of the CML gate 100. These electronic paths may include a pair of transistors. An input signal may be transmitted through the transistors to produce an output signal. In the preferred embodiment of the disclosure, the electronic paths 110 are identical. Identical electronic paths are advantageous because paths differing in length or containing different components may cause signal noise that may adversely affect the operation of the CML gate.

The electronic paths 110 are physically separated from one another to transmit output signals that are independent from one another. These output signals may be used to identify an incorrect output signal caused by a single-event effect. The physically separated and identical electronic paths 110 may transmit multiple input signals through the CML gate to prevent unwanted voltage pulses from propagating through the electronic circuit causing unwanted changes of state in memory elements of output devices or an incorrect value latched within an output device, such as a sequential-logic unit.

In the preferred embodiment of the disclosure, the pair of transistors in each electronic path 110 are not positioned next to one another where the transistors may contact each other. Rather, the pairs of transistors in each electronic path 110 are to be located at a distance from one another. For example, each pair of transistors in the electronic paths 110 may be located on different areas of the die containing the CML gate 100.

The amount of distance between the pairs or transistors is dependant on the technology installed in the CML gate. In some embodiments of the disclosure a distance of several microns may be sufficient. No matter the amount of distance between the pairs of transistors, the pairs of transistors are not to be positioned on the dies, such that, an electronic effect affecting the voltage passing through one pair of transistors also affects the voltage passing through the second pair of transistors connected to another electronic path.

Figure 2:
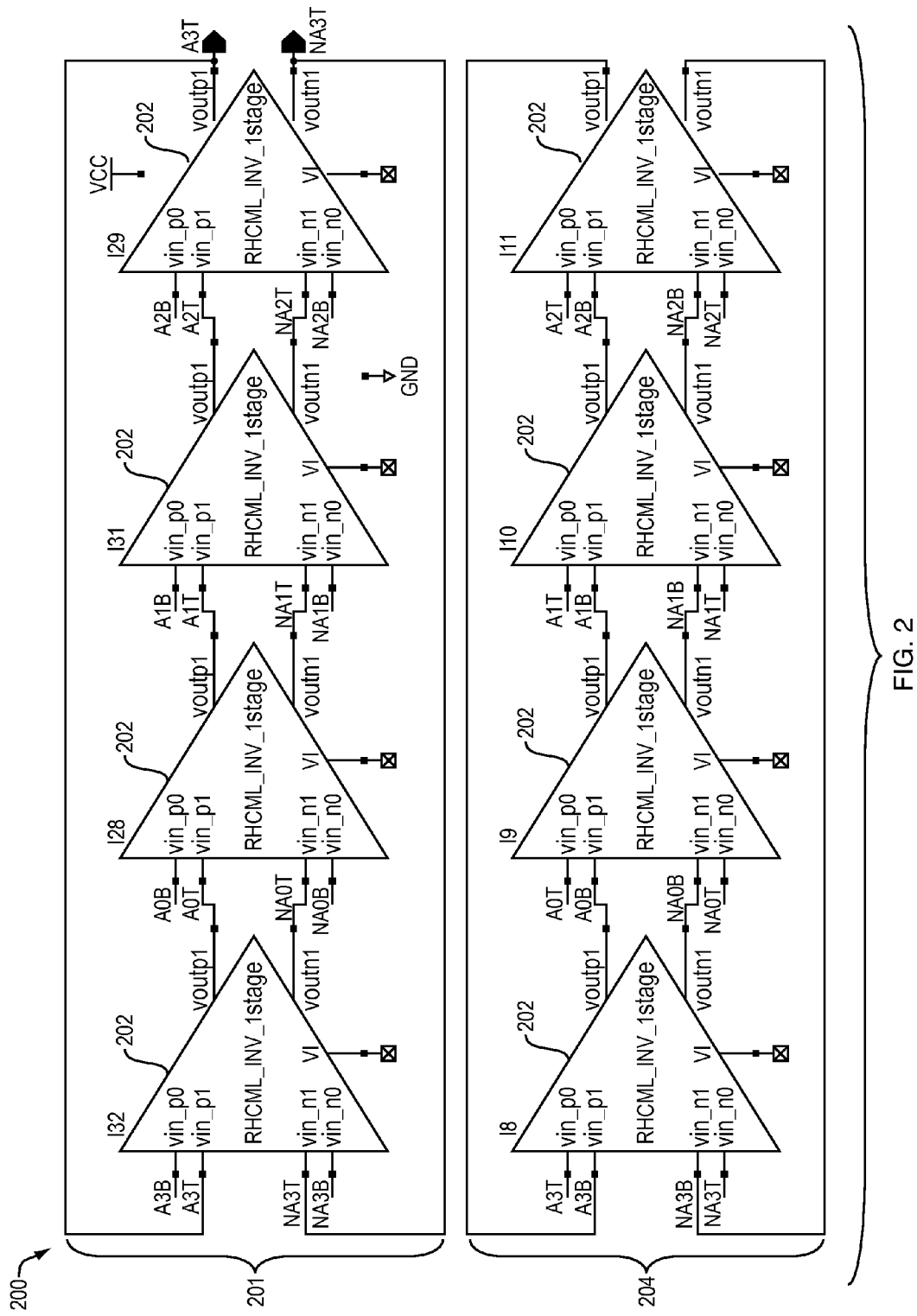
FIG. 2 is a RH Ring OSC block diagram illustrating an electronic circuit of the preferred embodiment of the disclosure having a primary electronic circuit path and a redundant electronic circuit path having several CML gates.

FIG. 2 is a RH Ring OSC block diagram illustrating an electronic circuit 200 according to a preferred embodiment of the present disclosure. This electronic integrated circuit may include but is not limited to a primary electronic path 201, a quantity of current-mode-logic (CML) gates 202, and a redundant electronic path 204. The primary electronic path 201 may include a group of several CML gates 202 connected together. In the preferred embodiment of the disclosure, the CML gates 202 are connected in series to one another.

In the preferred embodiment of the present disclosure, the CML gates 202 have at least two separate and identical electrical paths connected to an output device wherein at least two output signals are produced by the CML gate and transferred to the output device. In this embodiment of the disclosure the output device may be a second CML gate 202 connected in series to a first CML gate 202. The CML gates 202 have been previously described in relation of FIG. 1.

The electronic circuit 200 may also include a redundant electronic path 204 having several CML gates 202 connected to one another and connected in parallel with the primary electronic path 201. The redundant electronic path 204 is physically separated from the primary path 201, such that, a single-event effect does not propagate between the primary electronic path 201 to the redundant electronic path 204. In the preferred embodiment of the present disclosure, the CML gates 202 are connected in series and the redundant path 204 is identical to the primary electronic path 201. In yet other embodiments of the present disclosure, the CML gates 202 may be connected in series and/or in parallel with one another.

The electronic circuit 200 shown in FIG. 2 may be desirable when the circuit is exposed to harsh operating environments. Having several CML gates 202 connected in series provides for a robust circuit design providing a high level of certainty that signal errors will not propagate through the electronic circuit 200. Moreover, having parallel electronic paths containing several CML gates 202 connected in series create an electronic circuit 200 having a high resistance against unwanted change of state in memory elements for output devices connected to the circuit.

In other embodiments of the present disclosure the electronic circuit may connected to phase-locked loop. A phase-locked loop is a control system that generates an output signal whose phase is related to the phase of an input reference signal.

In some other embodiments, the electronic circuit may be connected to a Serializer/Deserializer (SerDes). This type of output device contains a pair of function blocks that convert data between serial data and parallel interfaces in each direction. This type of output device is commonly used in high-speed communication applications to compensate for limited input or output.

Similarly, the electronic circuit may also be connected to an analogue to digital converter (ADC). This device converts an input signal to a digital number that represents the input single's amplitude. In some other embodiments of the present disclosure the output device may be a sequential-logic unit 404 that receives output signals from the CML gate to indicate an output value.

Other embodiments of the present disclosure may include the electronic circuit having an output device that stores the output signals from the CML gates. Two or more CML gate output signals may be stored in at least two memory elements of the output device. In the preferred embodiment of the disclosure the memory elements are nodes 406.

In yet other embodiments of the present disclosure, a filter 402 may be connected to the CML gate 202 for receiving output signals from the gate. This filter 402 may inhibit the transmission of the CML gate's output signals to other portions of the electronic circuit when the output signals are not equal or the same. Typically, output signals for CML gates have a value of either one or zero. When the CML gate output signals are equal to one another the filter may change state allowing the output signals to be transmitted to another location of the electronic circuit. An example of a filter for this type of application may be a guard gate.

Figure 3:
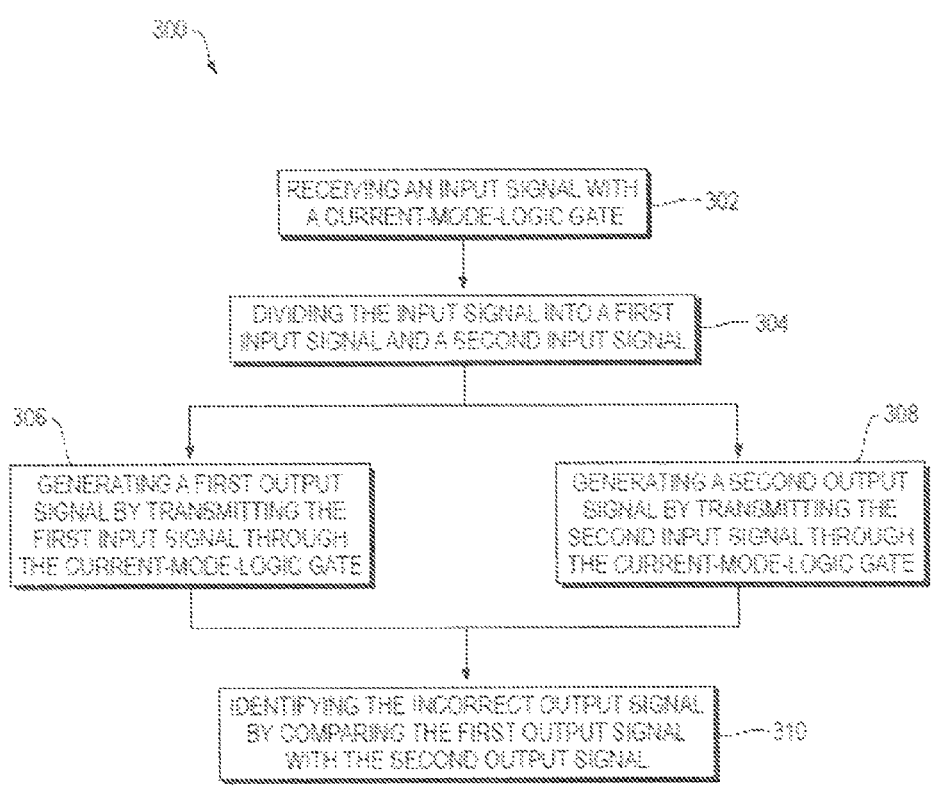
FIG. 3 is a flow diagram of a method for preventing the propagation of an incorrect output signal in an electronic circuit according to an example embodiment of the present disclosure.
Figure 4:
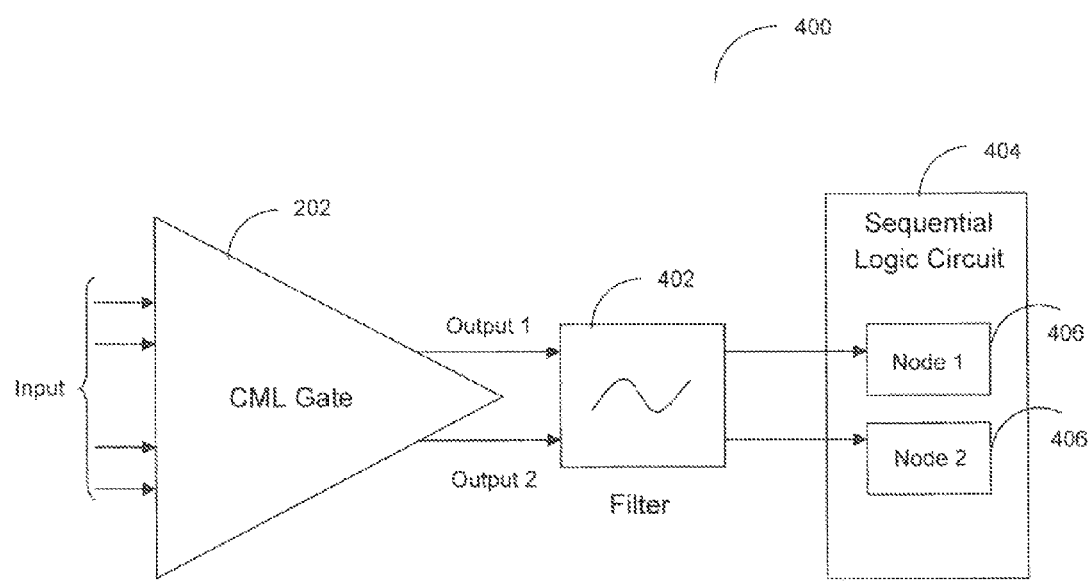
FIG. 4 is an illustration of transmitting of output signals from the CML gate to the plurality of nodes in the output device through a filter according to an example embodiment of the present disclosure.

FIG. 3 is a flow diagram of a method for preventing the propagation of an incorrect output signal in an electronic circuit 300 according to an example embodiment of the present disclosure. At block 302 an input signal may be received by a CML gate. The input signal may be any type of electronic impulse that may be received by a CML gate. Moreover, the input signal may be any form of electronic signal that is typically used in logic gates. In the preferred embodiment of the disclosure, the input signal is generated by a voltage source.

At block 304 an input signal may be divided into a first input signal and a second input signal. By dividing the input signal into a plurality of signals and transmitting those signals through separate and identical electronic paths of the CML gate the output signals from those electronic paths may be compared to identify a signal error. Identical electronic paths are advantageous because paths differing in length or resistance may cause signal noise adversely affecting CML gate operation.

In the preferred embodiment of the disclosure the input signal may be divided into two signals by transmitting the signals through two separate and identical electronic paths within the CML gate. A first input signal may be separated from a second input signal by transmitting the first input signal through a first electronic path in the CML gate. The second input signal may be transmitted through a second electronic path in the CML gate that is physically separated and identical to the first electronic path.

At block 306 a first output signal may be generated by transmitting the first input signal through the CML gate. The first input signal may be transmitted through an electronic path containing a pair of transistors. In some embodiments of the present disclosure a high voltage first input signal may be transmitted through the CML gate producing a low voltage output having a output value of zero. Conversely, when a low voltage first input signal when transmitted through the CML gate may produce a high voltage output signal having an output value of one. At block 308 a second output signal may be generated by transmitting the second input signal through the CML gate as previously described in regards to block 306.

At block 310 an incorrect output signal may be identified by comparing the first output signal with the second output signal. In the preferred embodiment of the present disclosure, an incorrect output signal is identified when the first output signal is not equal or not the same as the second output signal. For example, typical N-type logic gates generate an output signal that is either a one or a zero. Moreover, N-type logic gates cannot produce an erroneous output signal having a value of one. Rather, only an erroneous output signal having a zero value may propagate through the gate. Therefore, when the first output signal has a value of one and the second input signal has a value of zero an incorrect output signal is identified. These output signals may be used to indicate the presence of a single event effect affecting the electronic circuit.

The presence of a single-event effect acting an electronic circuit may be identified by transmitting an input signal through at least two physically separated and identical electronic paths of a CML gate creating at least two output signals. These output signals may be compared to one another. A single event effect may be identified when the electronic circuit's output signals are not equal to one another or have different values. In other embodiments of the present disclosure, the presence of the single-event effect may be identified by comparing output values associated with the output signals from the CML gate.

In other embodiments of the present disclosure, a filter may be connected to the CML gate to receive the first output signal and the second output signal. The filter may be connected to an output device, such that, when the filter changes state the CML gate output signals are transmitted to the output device. This filter may prevent the propagation of an incorrect output signal to an output device by changing state to transmit the output signals only when the output signals are equal.

In some embodiments of the present disclosure, the output signals may be stored on a node. Moreover, the individual output signals may be stored on individual nodes that are independent from one another. One method for having independent nodes in an electronic circuit is to physically separate the nodes from one another. Separating the output signals on physically separated nodes reduces the risk that a single-event effect affecting one node will affect the output signals stored on the remaining nodes. Isolating the various nodes from one another within an electronic circuit reduces the risk of erroneous output signal propagating through the circuit because the single-event effect is unlikely to affect all isolated nodes. Having more isolated nodes within a circuit improves the electronic circuit's ability to prevent the propagation of an output signal error because the more output signals that are compared the less likely that an error will go undetected.

While the present disclosure has been described in connection with the preferred embodiments of the various figures, it is understood that other similar embodiments may be used or modification or additions may be made to the described embodiments for performing the same function of the present disclosure without deviating therefrom. Therefore, the present disclosure should not be limited to any single embodiment, but rather construed in breadth and scope in accordance with the recitation of the appended claims.

All referenced patents and applications are incorporated herein by reference in their entirety. Furthermore, where a definition or use of a term in a reference, which is incorporated by reference herein is inconsistent or contrary to the definition of that term provided herein, the definition of that term provided herein applies and the definition of that term in the reference does not apply It may be possible to execute the activities described herein in an order other than the order described. And, various activities described with respect to the methods identified herein can be executed in repetitive, serial, or parallel fashion.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

Other embodiments will occur to those skilled in the art and are within the following claims.

What is claimed is:

1. A current-mode-logic gate comprising:
 a first electronic path comprising:
  a first pair of transistors wherein a first input signal is applied to the first pair of transistors to produce a first output signal; and
 a second electronic path that is physically separated and identical to the first electronic path, whereby the physical separation of the two physically separated electronic paths prevents a Single-Event Upsets and Single-Event Transients from adversely affecting respective voltages of the two output signals, comprising:
  a second pair of transistors wherein a second input signal is applied to the second pair of transistors to produce a second output signal;

an electronic filter for receiving output signals connected to output of the first pair of transistors and output of the second pair of transistors, wherein the electronic filter inhibits the transmission of the output signals if the output signals are not equal.

2. The electronic circuit of claim 1 wherein the first pair of transistors does not contact the second pair of transistors.

3. An electronic circuit composing:
an output device having a plurality of memory elements; and
at least one current-mode-logic gate having at least two physically separate and identical electrical paths connected to the output device wherein at least two output signals are produced by the current-mode-logic gate and transferred to the output device, whereby the physical separation of the two physically separated electronic paths prevents a Single-Event Upsets and Single-Event Transients from adversely affecting respective voltages of the two output signals;
an electronic filter for receiving the output signals connected to output of the current-mode-logic gate, wherein the electronic filter inhibits the transmission of the output signals from the output of the current-mode-logic gate to the output device if the output signals are not equal.

4. The electronic circuit of claim 3 wherein at least two output signals are stored in at least two memory elements of the output device.

5. The electronic circuit of claim 3 wherein the plurality of memory elements are nodes.

6. The electronic circuit of claim 3 wherein the output device is a sequential logic unit wherein the output signals indicate an output value in the sequential logic unit.

7. The electronic circuit of claim 3 wherein the electronic filter is a guard gate.

8. The electronic circuit of claim 3 further comprising:
a first electronic circuit path containing a plurality of current-mode-logic gates connected to one another; and
a second electronic circuit path that is physically separated and identical to the first electronic circuit path containing a plurality of current-mode-logic gates connected to one another, whereby the physical separation of the two physically separated electronic paths prevents a Single-Event Upsets and Single-Event Transients from adversely affecting respective voltages of the two output signals.

9. A method for preventing the propagation of an incorrect output signal in an electronic circuit comprising:
dividing an input signal into a first input signal and a second input signal;
generating a first output signal by transmitting the first input signal through a current-mode-logic gate;
generating a second output signal by transmitting the second input through the current-mode-logic gate; and
identifying the incorrect output signal by comparing the first output signal with the second output signal by means of an electronic filter wherein the incorrect output signal is detected when the first output signal is not the same as the second output signal, wherein the first output signal and the second output signal are respective outputs derived from two physically separate electronic paths associated with the current-mode-logic gate.

10. The method of claim 9 further comprises assigning a first numerical value to the first output signal and a second numerical value to the second output signal wherein the incorrect output signal is detected when the first numerical value is not equal to the second numerical value.

11. The method of claim 9 further comprising storing the first output signal on a first node and storing the second output signal on a second node wherein the first node is independent of the second node.

12. The method of claim 11 wherein the first node is physically separated from the second node.

13. The method of claim 9 further comprises transmitting the first output signal and the second output signal through a filter to an output device.

14. The method of claim 13 wherein the filter changes state when the first output is the same as the second output signal allowing the first output signal and the second output signal to be transmitted to the output device.

15. The method of claim 9 further comprises receiving the input signal using the current-mode-logic gate.

16. The method claim of claim 9 further comprises separating the first input signal and the second input signal by transmitting the first input signal through a first electronic path in the current-mode-logic gate and transmitting the second input signal through a second electronic path in the current-mode-logic gate that is physically separated and identical to the first electronic path.

17. A method for identifying the presence of a single-event effect for an electronic circuit comprising:
transmitting an input signal through at least two physically separated and identical electronic paths of a current-mode-logic gate to create at least two output signals; and
comparing at least two output signals by means of an electronic filter wherein the single-event effect is identified when the output signals are not equal, whereby the physical separation of the two physically separated electronic paths prevents a Single-Event Upsets and Single-Event Transients from adversely affecting respective voltages of the two output signals.

18. The method of claim 17 wherein the output signals are compared by evaluating an output value associated with each one of the output signals to determine whether the output values are equal.

19. The method in claim 1 wherein a plurality of CML gates are connected in series to create an electronic circuit comprising a high resistance against unwanted change of state in memory elements for output devices connected to the electronic circuit.

* * * * *